US008415789B2

(12) United States Patent
Ishihara

(10) Patent No.: US 8,415,789 B2
(45) Date of Patent: Apr. 9, 2013

(54) THREE-DIMENSIONALLY INTEGRATED SEMICONDUTOR DEVICE AND METHOD FOR MANUFACTURING THE SAME

(75) Inventor: Masamichi Ishihara, Kitakyushu (JP)

(73) Assignee: Kyushu Institute of Technology, Fukuoka (JP)

(*) Notice: Subject to any disclaimer, the term of this patent is extended or adjusted under 35 U.S.C. 154(b) by 0 days.

(21) Appl. No.: 12/991,149

(22) PCT Filed: May 7, 2009

(86) PCT No.: PCT/JP2009/001999
§ 371 (c)(1),
(2), (4) Date: Nov. 5, 2010

(87) PCT Pub. No.: WO2009/136496
PCT Pub. Date: Nov. 12, 2009

(65) Prior Publication Data
US 2011/0062584 A1    Mar. 17, 2011

(30) Foreign Application Priority Data
May 9, 2008   (JP) .............................. 2008-123446

(51) Int. Cl.
*H01L 23/34* (2006.01)

(52) U.S. Cl.
USPC ............ 257/723; 257/685; 257/686; 257/726

(58) Field of Classification Search ................ 257/685, 257/686, 723, 726
See application file for complete search history.

(56) References Cited

U.S. PATENT DOCUMENTS

| 5,570,274 | A * | 10/1996 | Saito et al. .................... 361/784 |
| 6,376,917 | B1 * | 4/2002 | Takeshita et al. ............. 257/778 |
| 6,894,395 | B2 * | 5/2005 | Oshima ......................... 257/777 |
| 7,208,824 | B2 * | 4/2007 | Lee et al. ...................... 257/686 |
| 7,298,037 | B2 * | 11/2007 | Yim et al. ..................... 257/686 |
| 7,374,969 | B2 * | 5/2008 | Cho et al. ...................... 438/112 |
| 7,589,407 | B2 * | 9/2009 | Karnezos ....................... 257/686 |
| 7,692,279 | B2 * | 4/2010 | Karnezos et al. ............. 257/686 |
| 7,903,426 | B2 * | 3/2011 | Kimura et al. ................ 361/760 |
| 8,067,268 | B2 * | 11/2011 | Carson et al. ................. 438/109 |
| 8,143,108 | B2 * | 3/2012 | Pendse .......................... 438/125 |
| 2003/0215993 | A1 * | 11/2003 | Oshima ......................... 438/200 |
| 2004/0120127 | A1 * | 6/2004 | Hirose .......................... 361/760 |

* cited by examiner

FOREIGN PATENT DOCUMENTS

| JP | 2003-243604 A | 8/2003 |
| JP | 2004-193404 A | 7/2004 |
| JP | 2005-203633 A | 7/2005 |

*Primary Examiner* — Marcos D. Pizarro
*Assistant Examiner* — Bilkis Jahan
(74) *Attorney, Agent, or Firm* — McGlew and Tuttle, P.C.

(57) ABSTRACT

A wiring substrate has, on each of opposite faces thereof, connection pad portions to which various circuit elements are connected, and wiring traces for connecting the connection pad portions. The wiring substrate also has a through wiring portion for establishing mutual connection between the connection pad portions and the wiring traces on the front face and those on the back face. A post electrode component is formed such that it includes a plurality of post electrodes supported by a support portion. A semiconductor chip is attached to the back face of the wiring substrate, and is connected to the connection pad portions on the back face. After the post electrode component is fixed to and electrically connected to the wiring traces at predetermined positions, and resin sealing is performed, the support portion is separated so as to expose end surfaces of the post electrodes or back face wiring traces connected thereto. Another circuit element is disposed on the front face of the wiring substrate, and is connected to the connection pad portions on the front face.

20 Claims, 13 Drawing Sheets

WIRING-ADDED POST ELECTRODE COMPONENT

UNIT STRUCTURE

CONNECTED STRUCTURE

TURN UPSIDE DOWN

POST ELECTRODE  RESIN SEAL  SIDE SURFACE EXPOSED

RESIN SEAL
FRONT FACE
BACK FACE
BACK FACE WIRING (a) FORMATION OF POST ELECTRODES AND DOUBLE FACE WIRING (b) APPLICATION OF SOLDER RESIST (c) APPLICATION OF ADHESIVE (d) AFTER ADHESION (a) APPLICATION OF RESIST

PHOTORESIST
MOTHER DIE (b) PATTERNING

PHOTORESIST PATTERN (c) PLATING

PLATING METAL (d) FLATTENING

FLAT SURFACE (e) REMOVAL OF RESIST

REMOVAL OF RESIST (f) SEPARATION

PLATING METAL

THREE-DIMENSIONALLY INTEGRATED SEMICONDUTOR DEVICE AND METHOD FOR MANUFACTURING THE SAME

TECHNICAL FIELD

The present invention relates to a three-dimensionally integrated semiconductor device in which various circuit elements, including a semiconductor chip, are attached to opposite faces of a wiring substrate, and to a method for manufacturing the same.

BACKGROUND ART

High-frequency characteristics are very important for an RF (radio frequency) module or the like used in cellular phones. The High-frequency characteristics of such a module are most sensitively affected by wiring between terminals of a semiconductor (LSI) chip and external components. Conventional wiring is long; i.e., each wiring line extends through LSI chip bonding wire, a package substrate, and a post electrode to a terminal of a component. In the case of an RF module, although the amount of wiring within the module is large, it is sufficient for the module to have a small number of external connection terminals. Although a conventional typical module technique can form multilayer wiring on the side toward the substrate of a package so as to increase the amount of wiring, in general, the conventional technique encounters difficulty in forming a large amount of wiring on the post electrode side. Furthermore, conventionally formed signal paths are two-dimensional. When signal paths are formed three-dimensionally, the signal paths can be shortened, and high-frequency characteristics are improved. In addition, mounting area can be reduced, whereby total cost can be lowered. Therefore, there has been demand for shortening signal paths through employment of three-dimensional integration.

FIG. 21 is a view exemplifying a conventional, three-dimensionally integrated semiconductor device (see Patent Document 1). An upper face wiring pattern composed of electrodes A, unillustrated wiring traces, etc. is formed on the upper face of a wiring substrate. Circuit elements such as active elements and passive elements (e.g., capacitors, resistors, inductors, and filters) are mounted on the electrodes A. A lower face wiring pattern composed of electrodes B, wiring traces connecting them, etc. is formed on the lower face of the wiring substrate. This lower face wiring pattern is electrically connected to the electrodes A on the upper face of the wiring substrate via unillustrated wiring.

Bump electrodes of an LSI chip are connected to the electrodes B of the lower face wiring pattern. Vertical connection holes extend from other electrodes C, and a connection portion formed of a thin metal film is formed on the wall surface of each of the connection holes. The thin metal film that constitutes the connection portion is united with an electrode D, which is formed on the surface of a seal portion and surrounds the corresponding connection hole.

Such a double face mounting semiconductor is attached onto a mother substrate. A wiring pattern including electrodes E and a ground electrode is formed on the mother substrate. The electrodes E and the ground electrode are formed such that they face the electrodes D and a heat radiating member, respectively, and are joined thereto by use of solder or the like. Heat generated in an active region of the upper surface of the semiconductor chip is radiated from the lower surface of the semiconductor chip to the mother substrate via the heat radiating member and the ground electrode.

As a result of mounting an LSI chip and various circuit elements on opposite faces of a wiring substrate as described above, mounting area can be reduced, whereby total cost can be reduced. In addition, signal paths can be shortened.

However, the illustrated semiconductor device has a complicated structure, and requires a complicated process especially for a connection structure for establishing connection between the wiring patterns provided on the wiring substrate and the mother substrate, respectively. In general, a semiconductor manufacturing process is divided into a former stage for fabricating an LSI and a latter stage for packaging the LSI. There are a few manufacturers that specialize in the latter stage but can cover the former stage. Manufacture of the illustrated semiconductor device requires a process for performing formation of vertical connection holes to be connected to electrodes on the wiring substrate, charging of an electrically conductive substance, etc.; that is, requires facilities similar to those used in the former stage, and cannot be performed by use of only conventional facilities for the latter stage.

PRIOR ART DOCUMENT

Patent Document

Patent Document 1: Japanese Patent Application Laid-Open (kokai) No. 2005-203633

SUMMARY OF THE INVENTION

Problems to be Solved by the Invention

An object of the present invention is to change planar integration to three-dimensional integration by use of simple means, and to shorten signal paths. Another object of the present invention is to enable processes which require facilities similar to those used in the former stage to be put together off line in the form of a component, to thereby enable manufacturers dedicated for the latter stage to enter into manufacture of such packages without large investment, and to readily cope with a future market expansion.

Means for Solving the Problems

The present invention provides a three-dimensionally integrated semiconductor device in which various circuit elements, including a semiconductor chip, are attached to opposite faces of a wiring substrate, and a method for manufacturing the same. The device and method have the following features. The wiring substrate has, on each of first and second main faces thereof, connection pad portions to which various circuit elements are connected, and wiring traces for connecting the connection pad portions. The wiring substrate also has a through wiring portion for establishing mutual connection between the connection pad portions and the wiring traces on the first main face and the connection pad portions and the wiring traces on the second main face. A post electrode component is formed such that it includes a plurality of post electrodes supported by a support portion. The semiconductor chip is attached to the first main face of the wiring substrate, and is connected to connection pad portions on the first main face. After the post electrode component is fixed to and electrically connected to the wiring traces at predetermined positions, and resin sealing is performed, the support portion is separated so as to expose end surfaces of the post electrodes. Another circuit element is disposed on the second main face of the wiring substrate, and is connected to the connection pad portions on the second main face.

The post electrode component may include back face wiring traces connected to the post electrodes. In this case, the back face wiring traces are exposed when the support portion is separated after the resin sealing. On the first main face side of the wiring substrate, the resin sealing is performed such that the post electrodes exposed to side surfaces of the formed resin seal, and the exposed post electrodes can be soldered to wiring traces of a mother substrate with solder fillets formed such that meniscus are formed on the side surfaces of the post electrodes.

Effects of the Invention

According to the present invention, planar integration can be readily changed to three-dimensional integration, and signal paths (an LSI chip—a wiring substrate—circuit elements) can be shortened in order to improve high-frequency characteristics. Thus, the performance of an RF (radio frequency) module can be improved, and the installation area thereof can be reduced, whereby high density mounting and enhancement of the performance of small-sized electronic equipment such as cellular phones become possible. The high density mounting can reduce the size and cost of equipment.

Furthermore, according to the present invention, the side surfaces of the post electrodes can be exposed. Therefore, solder fillets can be formed on the side surfaces, whereby the mounting strength can be increased considerably.

BRIEF DESCRIPTION OF THE DRAWINGS

FIGS. 2(A) to 2(C) are views showing the details of a wiring-added post electrode component, wherein FIG. 2(A) is a side cross-sectional view of a unit structure for a single package, FIG. 2(B) is a perspective view of the unit structure, and FIG. 2(C) is a perspective view of a structure in which four unit structures for four packages are connected together.

MODE FOR CARRYING OUT THE INVENTION

Figure 1:
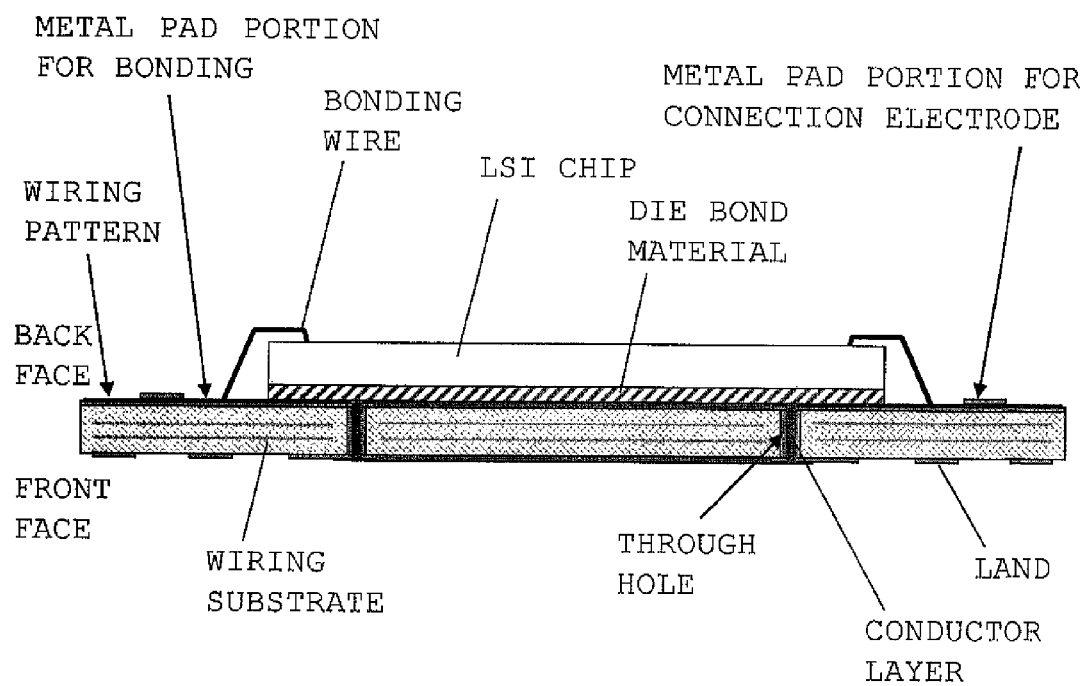
FIG. 1 is a view showing a state in which a semiconductor chip (LSI chip) is bonded and connected to the back face of a wiring substrate (multilayer organic substrate).

The present invention will now be described by way of example. A first embodiment of the three-dimensionally integrated semiconductor device of the present invention will be described with reference to FIGS. 1 to 8. FIG. 1 is a view showing a state in which a semiconductor chip (LSI chip) is bonded and connected to the back face of a wiring substrate (multilayer organic substrate). Notably, in the following description, the upper side of the wiring substrate in FIG. 1 on which the LSI chip is mounted will be referred to as the back face (first main face), and the lower side of the wiring substrate in FIG. 1 on which another circuit element is mounted as will be described later will be referred to as the front face (second main face). In the illustrated example, the LSI chip is bonded to the upper side (as viewed in FIG. 1) of the multilayer organic substrate by use of a die bond material, and is connected to the uppermost wiring pattern of the organic substrate via bonding wires. Metal pad portions for boding, which serve as bonding wire connection electrodes, and wiring to the pad portions are formed on the uppermost wiring pattern of the multilayer organic substrate.

In the following, the present embodiment will be described, while the case where the multilayer organic substrate is used as a wiring substrate is taken as an example. However, the present invention is not limited to the multilayer organic substrate, and can be applied to any other wiring substrate, including a silicon substrate, so long as the wiring substrate has, on each of opposite faces thereof, connection pad portions to which various circuit elements are connected, and wiring connecting the connection pad portions, and also has a through wiring portion for establishing mutual connection between the connection pad portions and wiring on one face and those on the other face.

The multilayer or monolayer organic substrate has a double layer wiring monolayer structure or a structure in which a plurality of substrates each having a wiring pattern are bonded together, and through holes are formed as needed so as to connect the wiring patterns of the substrates. A conductor layer is formed in each of the through holes, and is connected to a corresponding land (end surface electrode portion) formed on the lower side in FIG. 1. Furthermore, a solder material may be applied to the land so as to form a bump electrode for external connection. Such a multilayer or monolayer organic substrate is known, for example, as a BGA (Ball Grid Array) batch molded organic substrate configured such that balls (bumps) formed of a solder material, which are called "solder balls," are provided on the front face thereof.

Figure 2A:
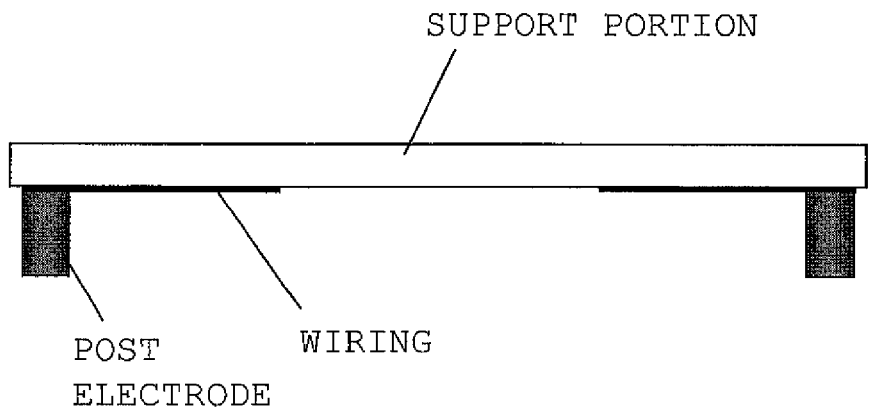
Figure 2B:
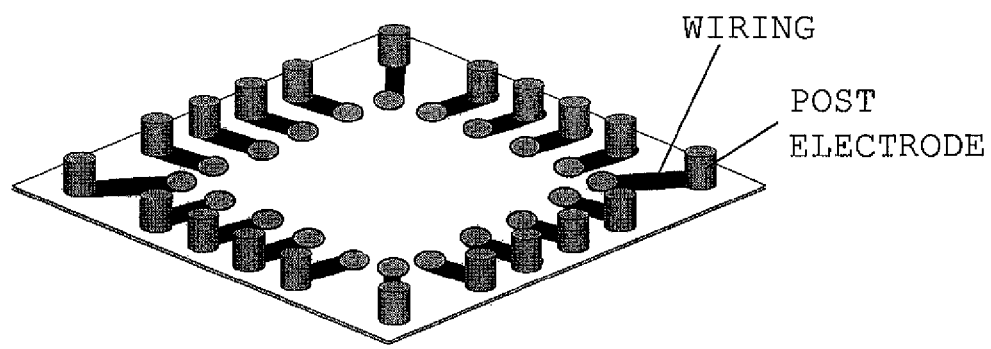
Figure 2C:
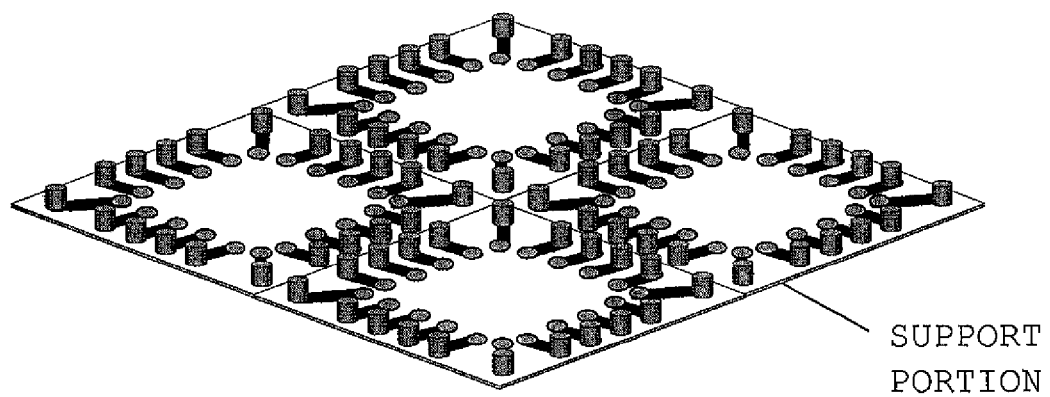

FIGS. 2(A) to 2(C) are views showing the details of a wiring-added post electrode component in which post electrodes are connected together by a plate-shaped support portion, wherein FIGS. 2(A) and 2(B) are a side cross-sectional view and a perspective view of a unit structure for a single package, and FIG. 2(C) is a perspective view of a structure in which four unit structures for four packages are connected together. In the wiring-added post electrode component, not only post electrodes supported by a support portion but also wiring traces connected thereto are formed. Thus, the illustrated wiring-added post electrode component have wiring traces formed therein. However, in the present invention, a post electrode component which is composed of post electrodes only and which includes no wiring trace can be used.

The unit structure and the structure in which four unit structures are connected together are configured such that wiring traces and a plurality of post electrodes are connected together by a support portion. The shape of the post electrodes is not limited to the illustrated circular columnar shape, and the post electrodes may have any of other columnar (bar-like) shapes such as a rectangular columnar shape and a polygonal columnar shape. The wiring traces and the post electrodes may be fabricated through electroforming.

Electroforming itself is well known. Electroforming is a "method of manufacturing, repairing, or replicating a metal product through electroplating," and is basically the same as electroplating. However, electroforming differs from electroplating in plating thickness, and also differs from electroplating in that an operation of separating a plating film is performed. Further, when a plating film is separated from a mother die and used, control and management of the physical properties of the plating film are important. A material including nickel, copper, a nickel alloy, or a copper alloy may be used as a plating metal (conductive material) to be deposited by electroforming. Stainless steel may be used as the material of the mother die. Alternatively, the mother die may be formed as follows. A material whose coefficient of thermal expansion does not differ greatly from that of a resin material used for resin sealing (e.g., copper) is used to form a base. The surface of the base is covered with a thin oxide film or the like which allows passage of electricity for plating therethrough and which facilitates separation of a plating pattern. The composition of a plating bath and plating conditions must be selected such that no internal stress is produced. In the case of nickel plating, nickel sulfamate bath is used as a plating bath.

Figure 22:
FIG. 22 is a set of process charts showing a method of manufacturing an electroformed component by use of photoresist.
Figure 22:
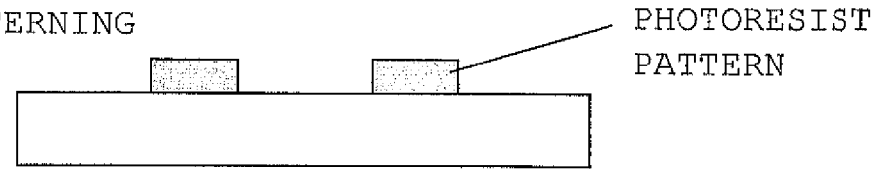
Figure 22:
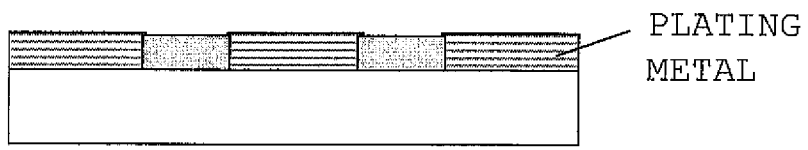
Figure 22:
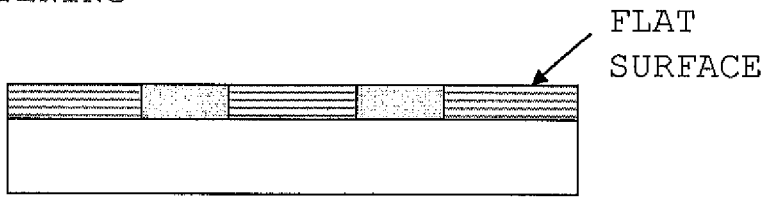
Figure 22:
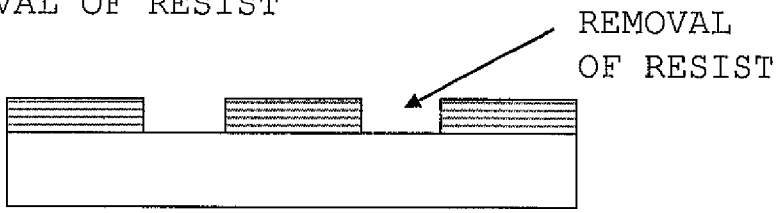
Figure 22:
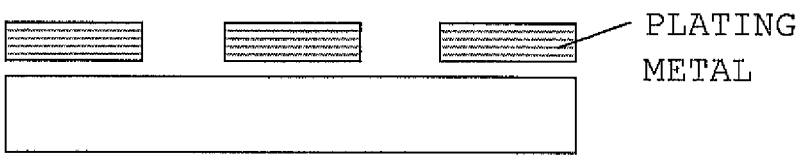

FIG. 22 is a set of process charts showing a method of manufacturing an electroformed component by use of photoresist. As shown in FIG. 22(a), photoresist (non-conductive film) is applied to an upper surface of a mother die of, for example, stainless steel. Subsequently, the photoresist is exposed to light through a pattern film to thereby form a pattern, followed by development, whereby an original plate for electroforming is formed (FIG. 22(b)). The photoresist pattern of the original plate for electroforming has a thickness greater than that of a product (post electrodes or wiring traces). In the case of the post electrodes, the photoresist pattern has a thickness of about 100 μm to 300 μm. Subsequently, a plating metal is deposited in opening portions of the photoresist pattern (FIG. 22(c)). An anode and a cathode are placed in a plating bath (e.g., nickel sulfamate solution) maintained at a proper temperature. The anode is formed of an electroforming metal to be deposited through electroforming. The cathode is an electroforming mother die of, for example, stainless steel. As shown in FIG. 22(c), a photoresist pattern is previously formed on the surface of the electroforming mother die serving as the cathode. When a current is caused to flow between the anode and the cathode, the electroforming metal of the anode melts, and is plated in the opening portions of the photoresist pattern on the electroforming mother die.

Next, as shown in FIG. 22(d), flattening machining is performed. Subsequently, the resist is removed (FIG. 22(e)), whereby the plating metal forms wiring traces or post electrodes. The plating metal is then separated from the electroforming mother die (FIG. 22(f)). The feature of electroforming resides in that separation of the formed plating metal and the support portion can be readily performed by means of heat and pressure.

For manufacture of the wiring-added post electrode component illustrated in FIGS. 2(A) to 2(C), the steps shown in FIG. 22(a) to FIG. 22(d) are repeated two times. In the first step, wiring traces are formed, and, in the second step, post electrodes to be connected to the wiring traces are formed. After that, the resist is removed, and the post electrodes connected to the wiring traces are separated.

Figure 3:
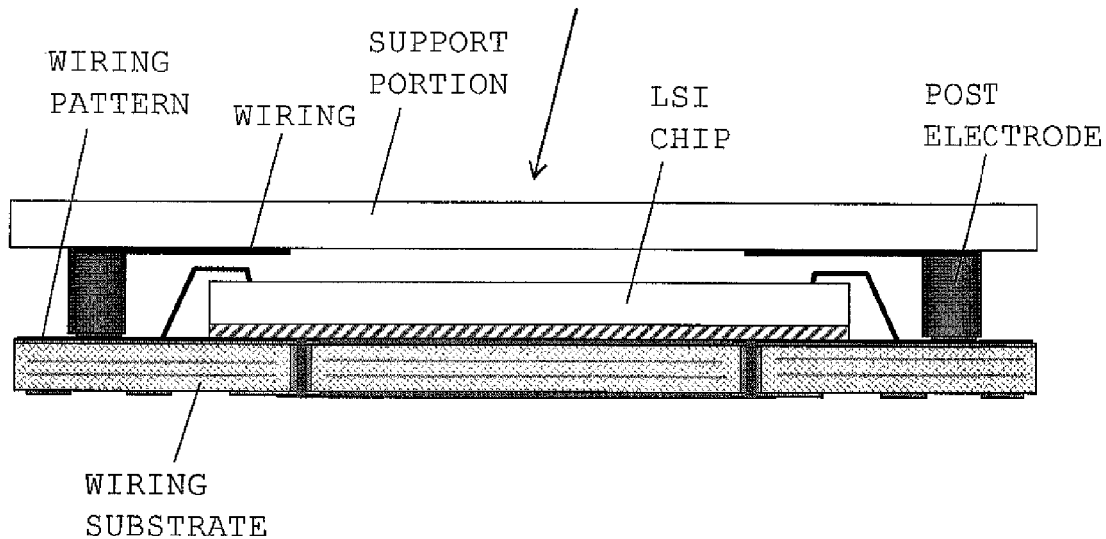
FIG. 3 is a view showing a state after the wiring-added post electrode component (see FIG. 2) has been connected to the wiring substrate (see FIG. 1) having the LSI chip bonded and connected thereto.

FIG. 3 is a view showing a state after the wiring-added post electrode component (see FIG. 2) has been connected to the wiring substrate (see FIG. 1) having the LSI chip bonded and connected thereto. The post electrodes are fixed and electrically connected to the wiring pattern of the organic substrate at predetermined positions (the positions of metal pad portions for connection electrodes shown in FIG. 1). The fixation and connection of the post electrodes may be effected by (1) ultrasonic joining, (2) connection by use of electrically conductive paste such as silver paste, (3) solder connection, or (4) a method of forming recesses in the meal pad portions for connection electrodes provided on the organic substrate, forming projections on the wiring-added post electrode component, and inserting the projections into the recess, followed by crimping.

Figure 4:
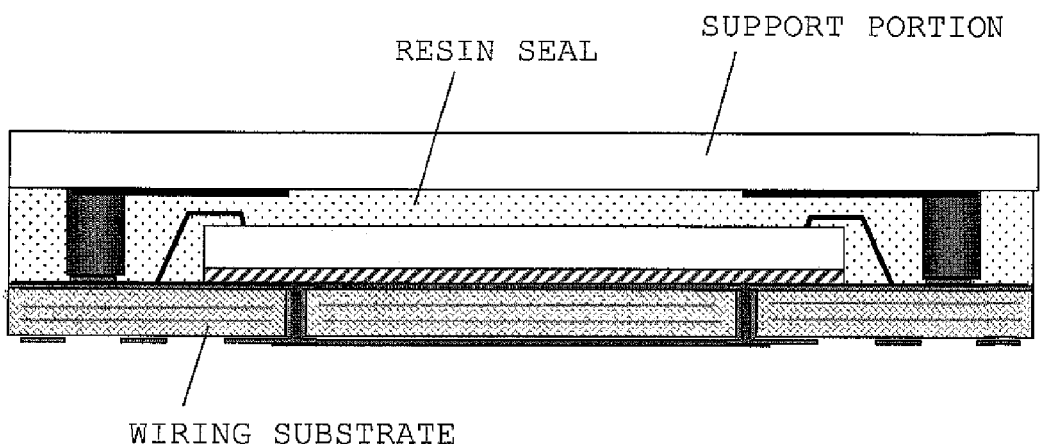
FIG. 4 is a view showing a state after resin seal has been formed.

FIG. 4 is a view showing a state after resin seal has been formed. After the post electrodes coupled together by the support portion are fixed, in this state, the upper surface of the wiring substrate is transfer-molded up to the lower surface of the support portion. Alternatively, the upper surface of the wiring substrate is resin-sealed by use of liquid resin (the material is, for example, an epoxy resin).

Figure 5:
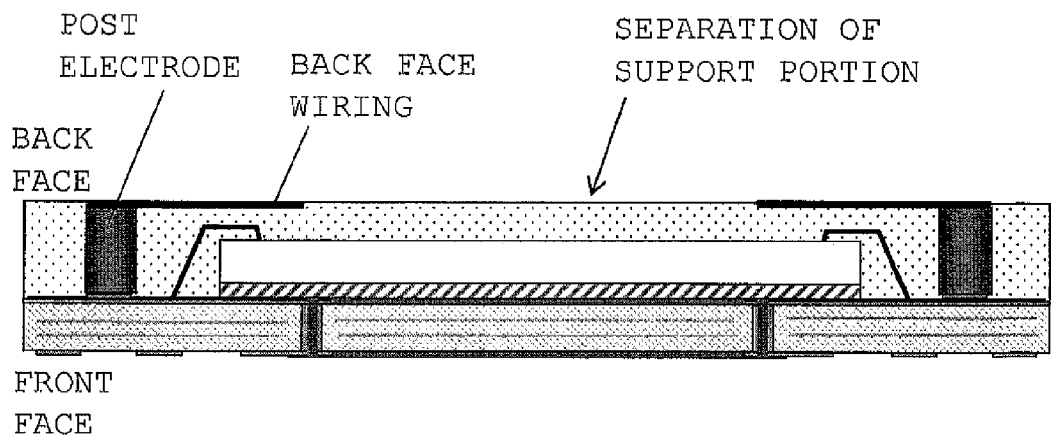
FIG. 5 is a view showing a state after a support portion (electroforming mother die) has been separated.

FIG. 5 is a view showing a state after the support portion (electroforming mother die) has been separated. As a result of separation of the support portion, the post electrodes and the back face wiring traces connected thereto are electrically separated from one another. The back face wiring traces exposed as a result of separation of the support portion can be used for external connection. In the case where a post electrode component which includes no back face wiring trace is used, end surfaces of the post electrodes can be used for external connection.

Figure 6:
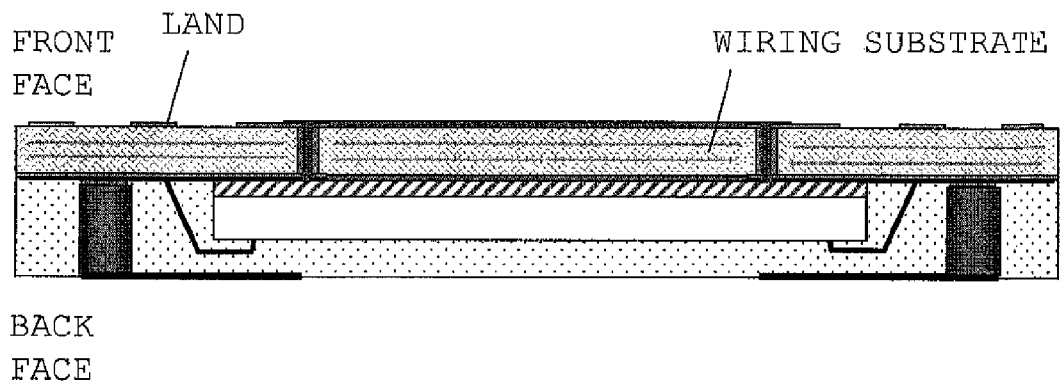
FIG. 6 is a view showing a state after the wiring substrate of FIG. 5 has been turned upside down.

FIG. 6 is a view showing a state after the wiring substrate of FIG. 5 has been turned upside down.

Figure 7:
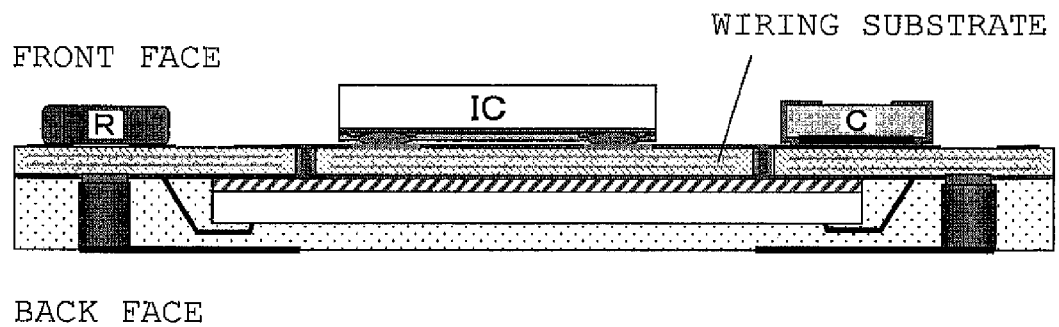
FIG. 7 is a view showing a state after various circuit elements have been attached to the front face side of the organic substrate.

FIG. 7 is a view showing a state after various circuit elements have been attached to the front face side of the organic substrate located on the upper side in FIG. 7. As shown in FIG. 7, circuit elements such as another semiconductor chip IC, a resistor R, and a capacitor C, are disposed on and connected to the wiring substrate at predetermined positions. Each circuit element is flip-chip-bond-connected to corresponding lands of the wiring substrate (organic substrate) by use of an ordinary technique.

Figure 8:
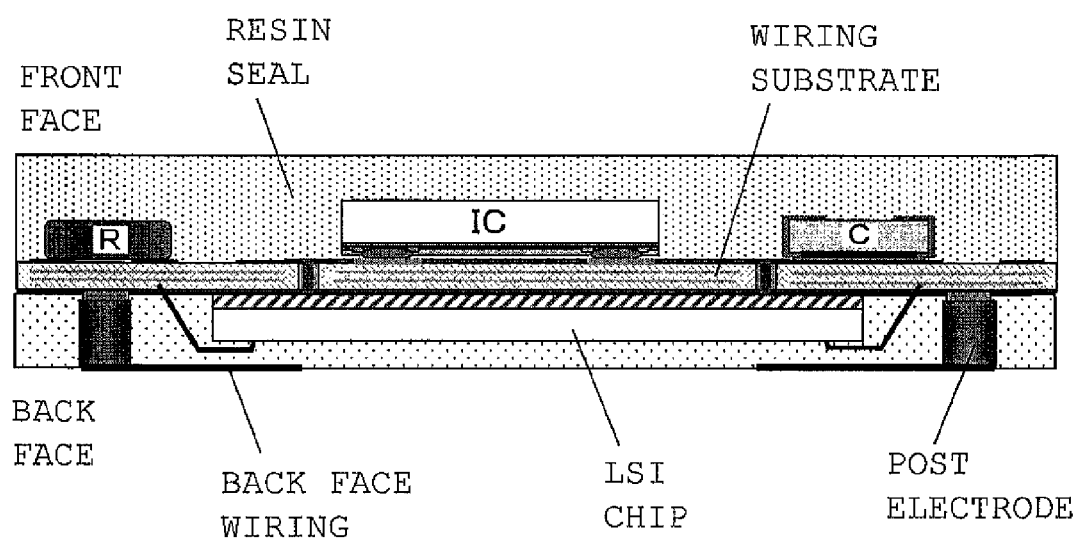
FIG. 8 is a view showing a state after the front face side of the organic substrate has been resin-sealed.
Figure 9:
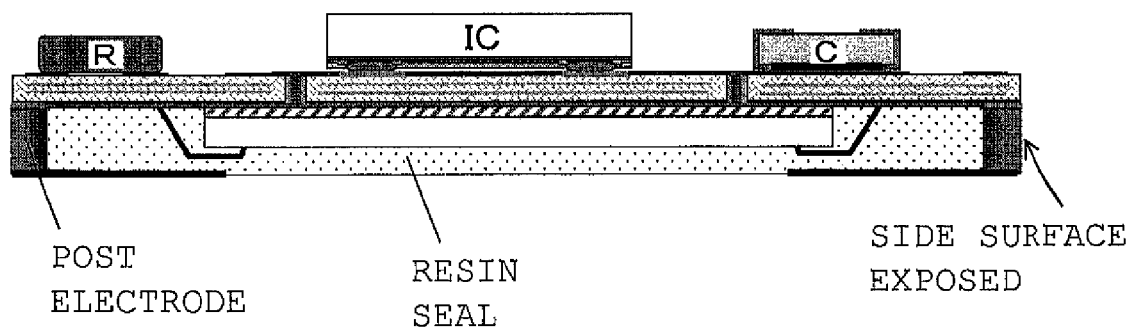
FIG. 9 is a view for describing a second embodiment of the present invention.

FIG. 8 is a view showing a state after the front face side of the organic substrate has been resin-sealed. Although the organic substrate having no resin seal can be used as a complete product, the organic substrate may be resin-sealed.

Although only one organic substrate is shown in the drawings, in actuality, a large number of organic substrates connected together are placed in a die, and resin is charged into the die. Thus, the organic substrates are transfer-molded, or resin-sealed by use of liquid resin (the material is, for example, an epoxy resin).

The device in this stage may be used as a complete product. However, after that, on the back face side (the lower side in the drawing), bump electrodes for external connection may be formed on the back face wiring traces at predetermined positions (at the distal ends of the back face wiring traces). Alternatively, in the case where a post electrode component which includes no back face wiring trace is used, the end surfaces of the post electrodes may be used as external electrodes for external connection. Alternatively, bump electrodes formed on the end surfaces of the post electrodes may be used as external electrodes. Furthermore, dicing is performed so as to separate individual chips (devices), whereby the devices are completed as products.

Figure 10:
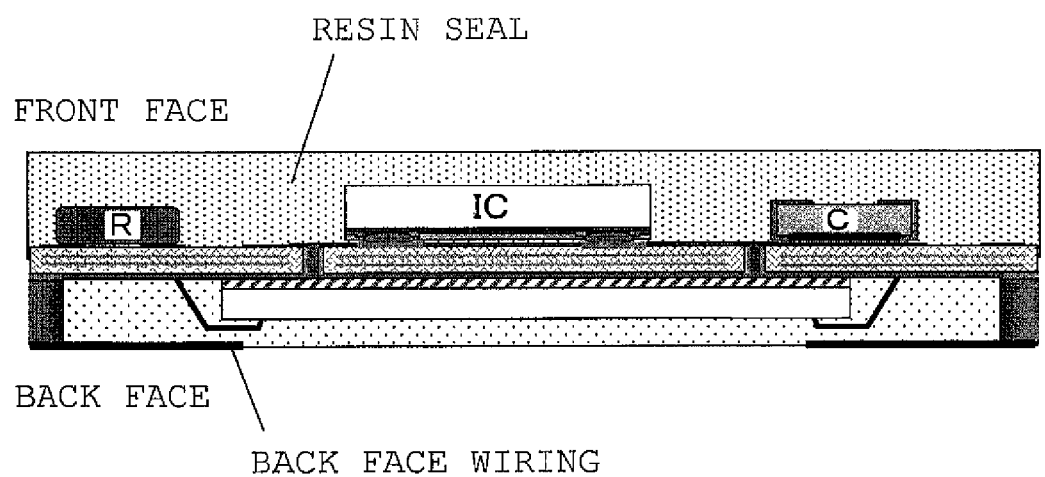
FIG. 10 is a view showing a state after the front face side has been resin-sealed.

Next, a second embodiment of the present invention will be described with reference to FIGS. 9 to 12. This second embodiment differs from the first embodiment only in the point that the post electrodes are exposed to the side surfaces of the resin seal. The device in this stage can be used as a complete product. However, the front face side may be resin-sealed as shown in FIG. 10, and bump electrodes for external connection may be formed on the back face wiring traces at predetermined positions.

Figure 11:
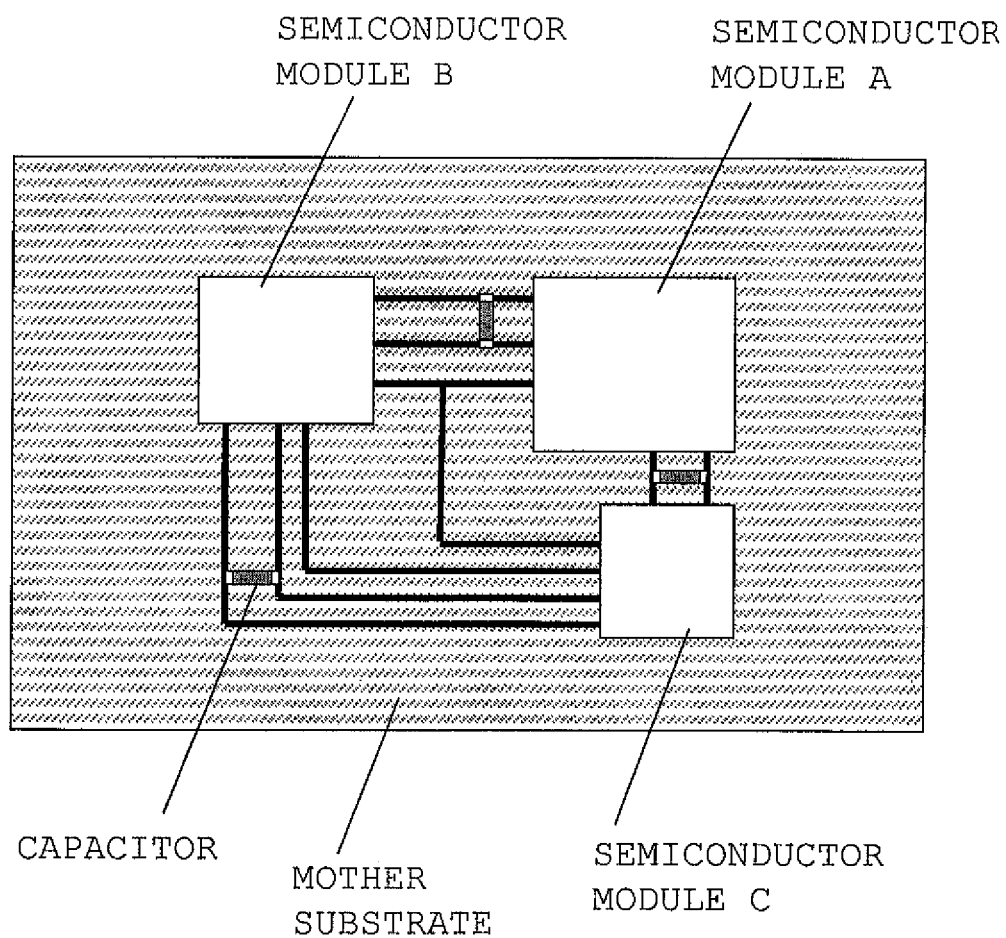
FIG. 11 is a plan view showing an example in which the semiconductor device of the second embodiment is used.
Figure 12:
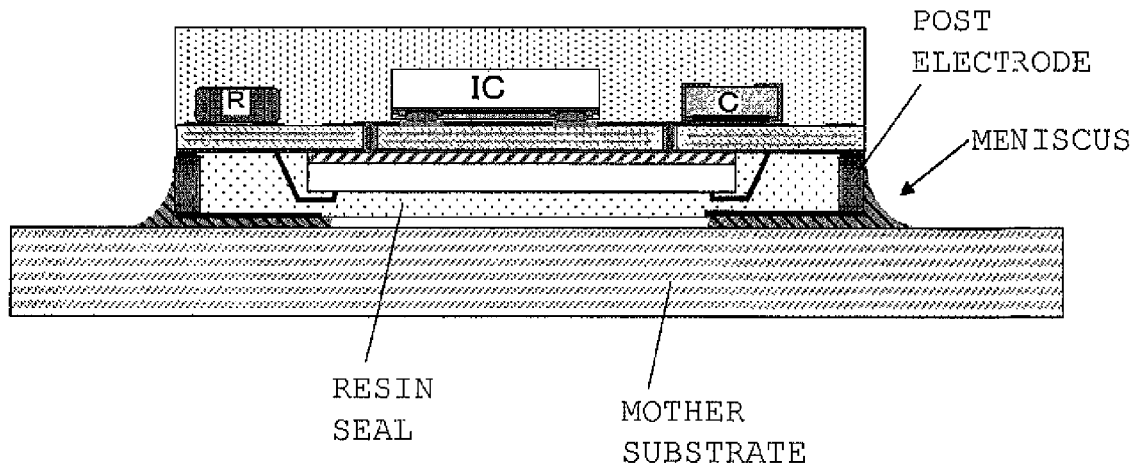
FIG. 12 is a side cross-sectional view showing one of semiconductor modules A to C shown in FIG. 11.

FIG. 11 is a plan view showing an example in which the semiconductor device of the second embodiment is used. FIG. 12 is a side cross-sectional view showing one of semiconductor modules A to C shown in FIG. 11. As shown in FIGS. 11 and 12, the semiconductor modules A to C and circuit elements such as capacitors are disposed on the wiring pattern of the mother substrate, and are electrically and mechanically connected thereto by means of soldering or the like. At that time, as shown in FIG. 12, solder fillets (the shape of solder surface formed at a connection portion after solidification of solder) are formed such that meniscuses (the shape formed by the surface of liquid when the surface deforms into a curved shape due to force such as surface tension) are formed on the side surfaces of the post electrodes exposed to the side surfaces of the resin seal, whereby connection strength can be increased.

Figure 13:
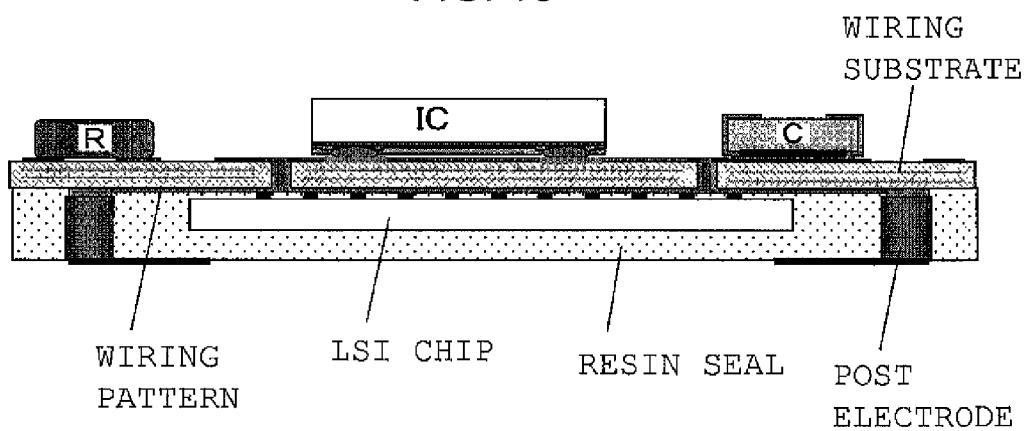
FIG. 13 is a view for describing a third embodiment of the present invention.
Figure 14:
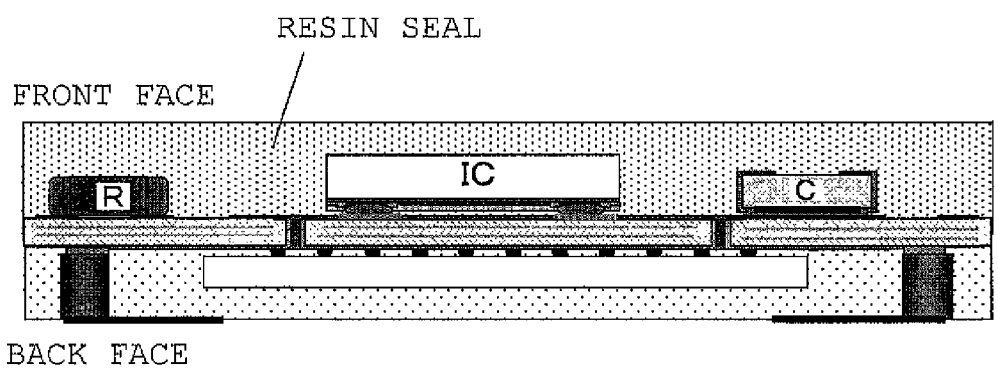
FIG. 14 is a view showing a state after resin sealing.

Next, a third embodiment of the present invention will be described with reference to FIGS. 13 and 14. This third embodiment differs from the first embodiment only in the point that the LSI chip is flip-chip-connected to the wiring substrate. As in the case of the first embodiments, the post electrodes are buried in the resin seal. The LSI chip is flip-chip-bond-connected to the uppermost wiring pattern of the wiring substrate (organic substrate) located on the lower side in FIG. 13 by use of an ordinary technique. FIG. 13 is a view showing a state before the front face is resin-sealed. FIG. 14 is a view showing a state after formation of the resin seal. The device in either state can be used as a complete product.

Figure 15:
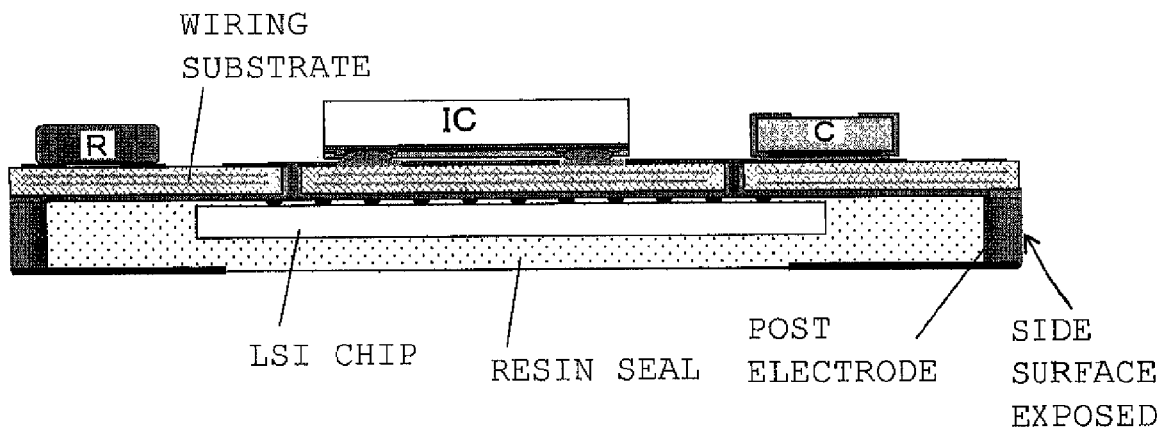
FIG. 15 is a view for describing a fourth embodiment of the present invention.
Figure 16:
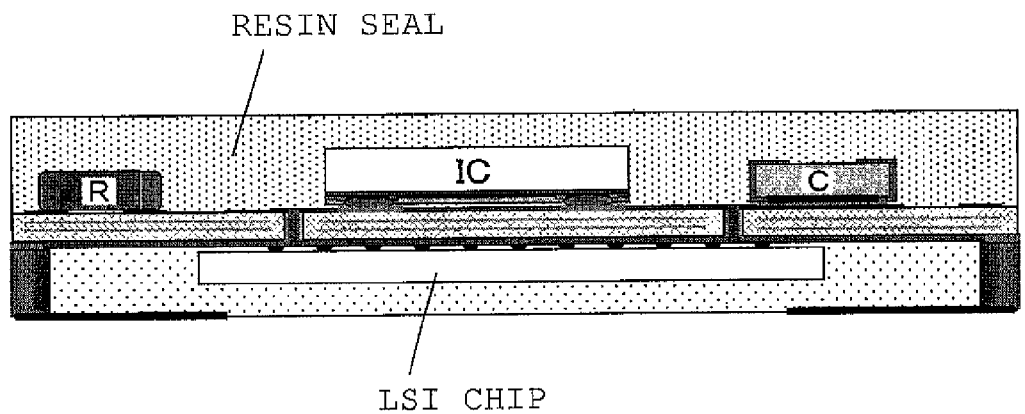
FIG. 16 is a view showing a state after resin sealing.

Next, a fourth embodiment of the present invention will be described with reference to FIGS. 15 and 16. This fourth embodiment differs from the second embodiment only in the point that the LSI chip is flip-chip-connected to the wiring substrate. As in the case of the second embodiments, the side surfaces of the post electrodes are exposed to the outside of the resin seal. FIG. 15 is a view showing a state before the front face is resin-sealed. FIG. 16 is a view showing a state after formation of the resin seal. The device in either state can be used as a complete product.

Figure 17:
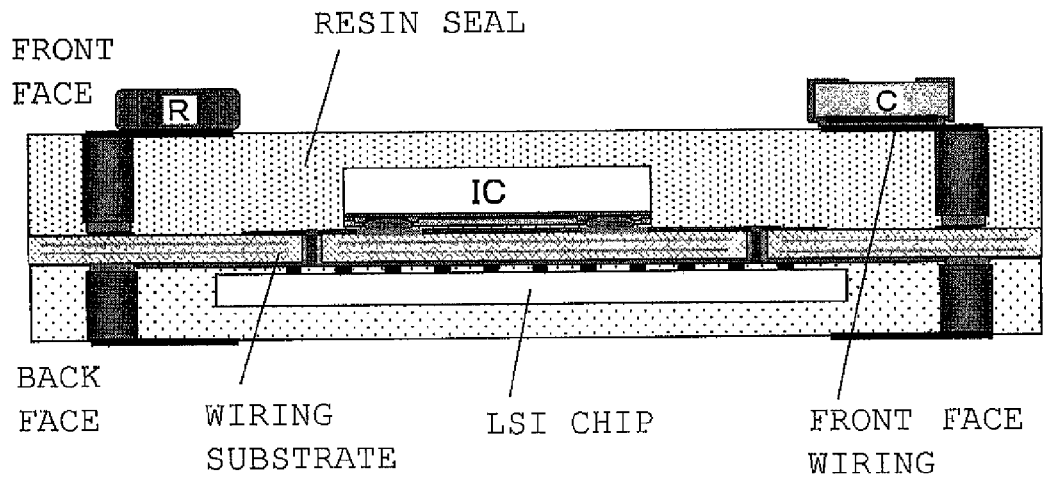
FIG. 17 is a view for describing a fifth embodiment of the present invention.

FIG. 17 is a view for describing a fifth embodiment of the present invention. After the circuit element IC is attached to the front face of the wiring substrate (organic substrate) as shown in FIG. 13, as in the case of the back face side, a wiring-added post electrode component as shown in FIGS. 2(A) to 2(C) is attached to the front face side. After that, as in the above-described example, the front face side is resin-sealed, and the support plate is separated. After that, various circuit elements (resistances R and capacitors C) are flip-chip-bond-connected to the front face wiring traces. As a result, a semiconductor device in which circuit elements are stacked in three tiers can be fabricated. By means of stacking another wiring-added post electrode component, circuit elements can be connected in four or more tiers.

Figure 18A:
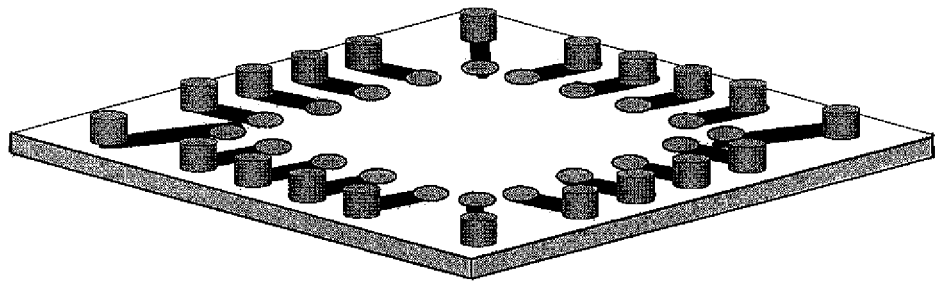
FIG. 18(A) is a perspective view showing a wiring-added post electrode component different from that shown in FIGS. 2(A) to 2(C)
Figure 18B:
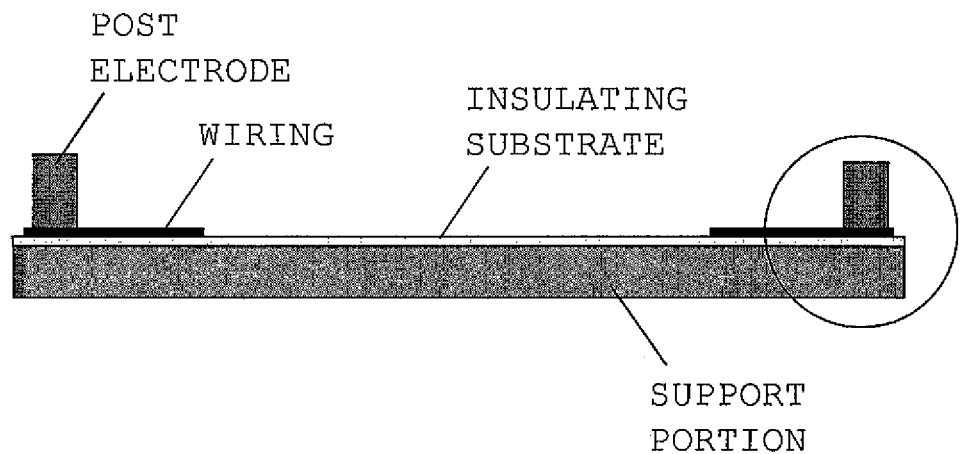
FIG. 18(B) is a cross-sectional view of the wiring-added post electrode component.
Figure 18C:
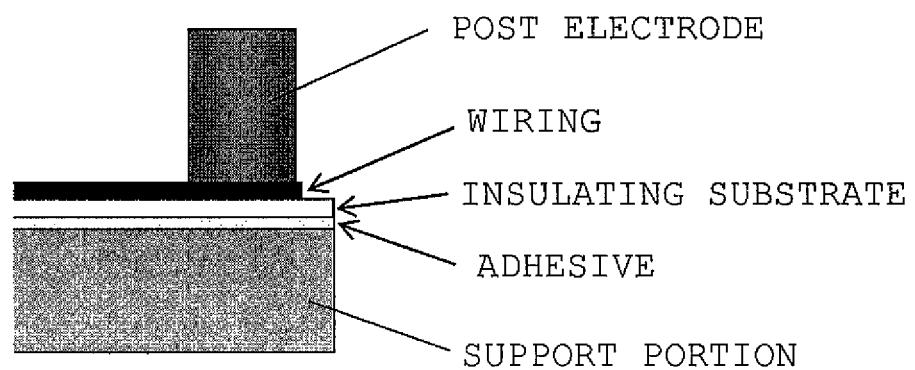
FIG. 18(C) is an enlarged view of a portion of FIG. 18(B) within a circle.

FIG. 18(A) is a perspective view showing a wiring-added post electrode component different from that shown in FIGS. 2(A) to 2(C), FIG. 18(B) is a cross-sectional view of the wiring-added post electrode component, and FIG. 18(C) is an enlarged view of a portion of FIG. 18(B) within a circle. Stainless steel (SUS) may be used for the support portion of the wiring-added post electrode component. In the case of the illustrated support portion, a tape formed from an insulation material in the form of a thin film, whose typical example is polyimide tape, is applied to the entirety of one face of the support portion. The support portion and the tape are separated from each other in a later step. Therefore, a treatment is performed in advance which treatment facilitates separation between the support portion and the tape upon application of, for example, a temperature higher than reflow temperature (equal to or higher than mold temperature). For example, adhesive containing thermal capsules is used. Alternatively, the support portion is formed of a light transmissible material (e.g., heat resistance glass which is low in thermal expansion), and an ultraviolet-ray-separation-type adhesive is used. Alternatively, a thermoplastic adhesive may be used.

Moreover, a metal seed layer which will become wiring traces is formed on this tape, whereby a metal-clad tape is formed. The seed layer may be formed of foil of gold, silver, copper, or palladium, which can be copper-plated. The wiring traces are formed through a process in which resist is applied to the seed layer, patterning is performed through exposure and development, etching is performed, and the resist is removed. A wiring layer is grown on this seed layer through plating. Furthermore, for formation of the post electrodes, application of resist and development are carried out thereon, and post portions are grown through plating. Alternatively, the wiring traces may be formed by means of directly patterning the seed layer by use of metal nanoparticles. In this case, the lithography step can be omitted (see the above-described meal particle wiring). Furthermore, for formation of the post electrodes, application of resist and development are carried out thereon, and post portions are grown through plating. Alternatively, a copper-foil-clad tape is processed by use of lithography, to thereby form wiring traces. Subsequently, for formation of the post electrodes, application of resist and development are carried out thereon, and post portions are grown through plating. Thus, the wiring-added post electrode component is completed.

Figure 19:
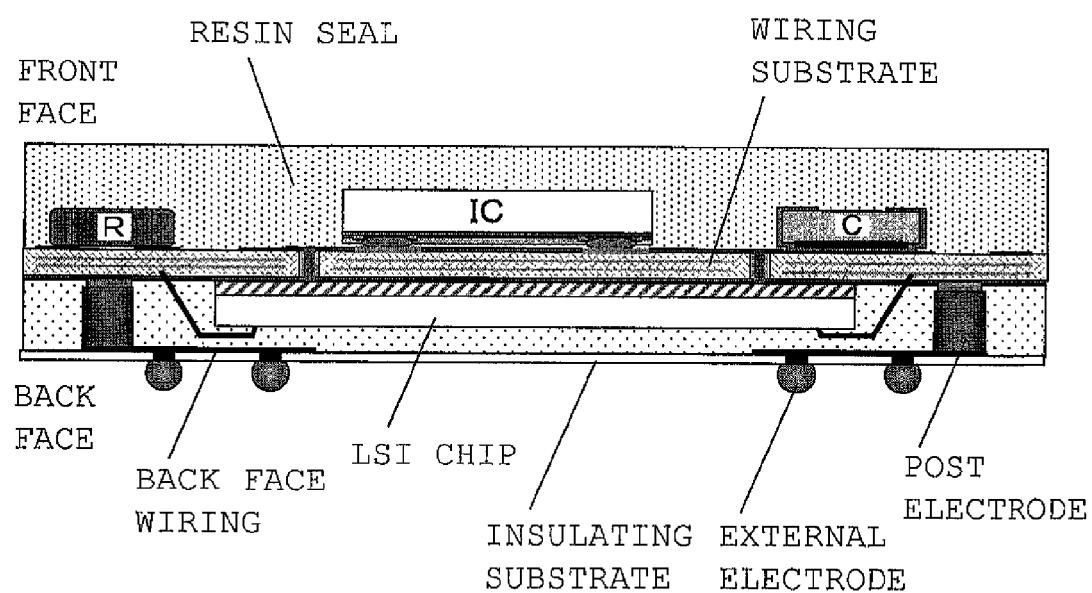
FIG. 19 is a view exemplifying a three-dimensionally integrated semiconductor device according to a sixth embodiment of the present invention.

FIG. 19 is a view for describing a sixth embodiment of the present invention. FIG. 19 corresponds to FIG. 8, and the device of FIG. 19 is obtained by adding an insulating substrate and external electrodes to the three-dimensionally integrated semiconductor device exemplified in FIG. 8. As in the above-described example, the wiring-added post electrode component exemplified in FIGS. 18(A) to 18(C) is connected and fixed to the wiring substrate carrying an LSI chip bonded and connected thereto, and is then resin-sealed. After that, for separation of the support portion, a predetermined high temperature is applied such that only the support portion is separated and the insulation substrate remains. The exposed insulation substrate functions as a protection film of a completed product. After that, on the back face side, holes are formed in the insulation substrate, and external electrodes are formed to be connected to the back face wiring traces exposed through formation of the holes. Similarly, the wiring-added post electrode component illustrated in FIGS. 18(A) to 18(C) may be applied to the three-dimensionally integrated semiconductor devices according to the second to fifth embodiments shown in FIGS. 10, 14, 16, and 17, whereby the semiconductor devices have an insulating substrate functioning as a protection film.

Figure 20:
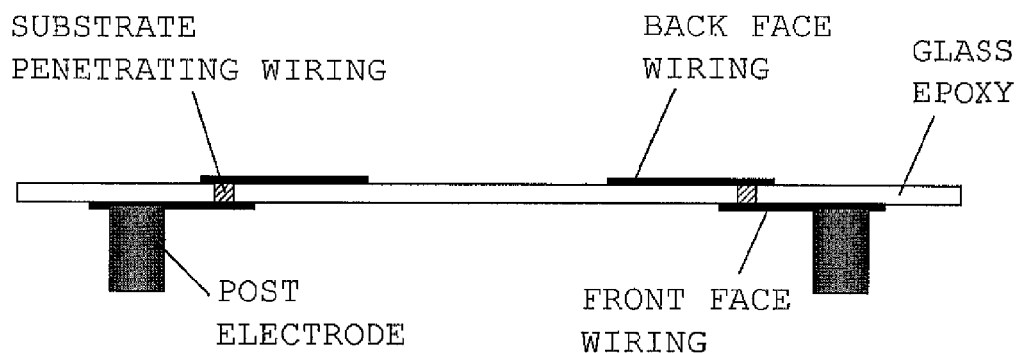
FIG. 20 is a set of views showing the steps of manufacturing a wiring-added post electrode component different from those shown in FIGS. 2(A) to 2(C) and FIGS. 18(A) to 18(C).
Figure 20:
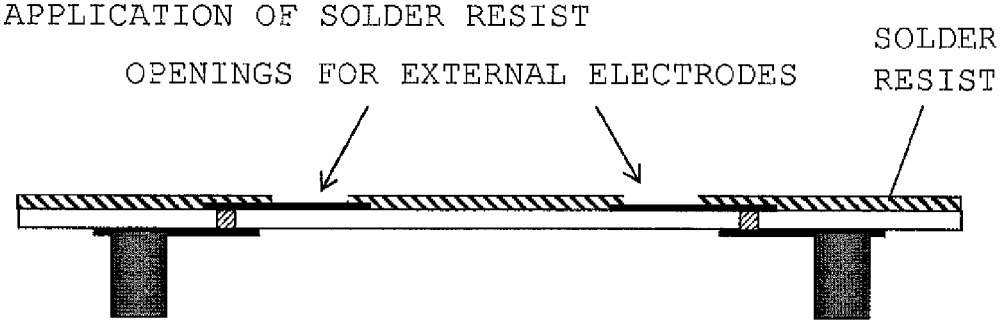
Figure 20:
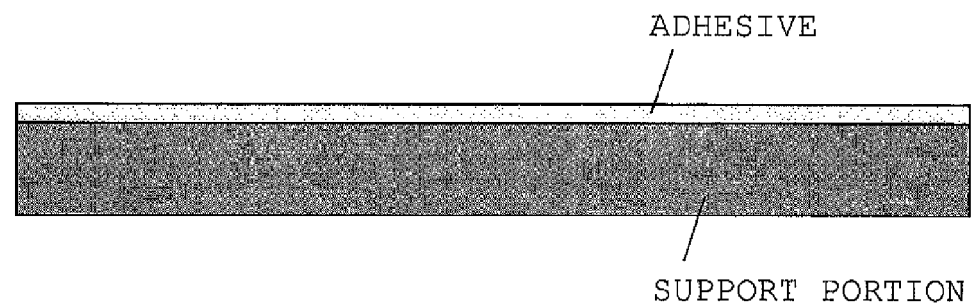
Figure 20:
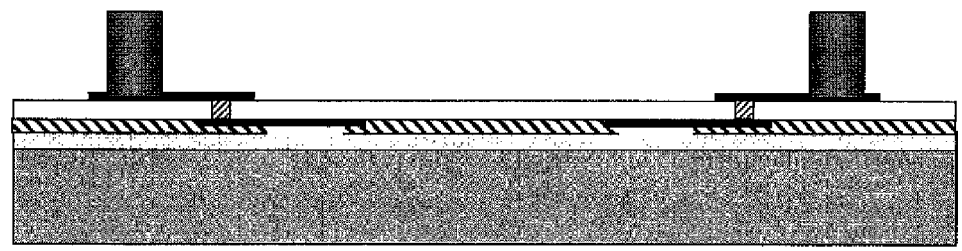
Figure 21:
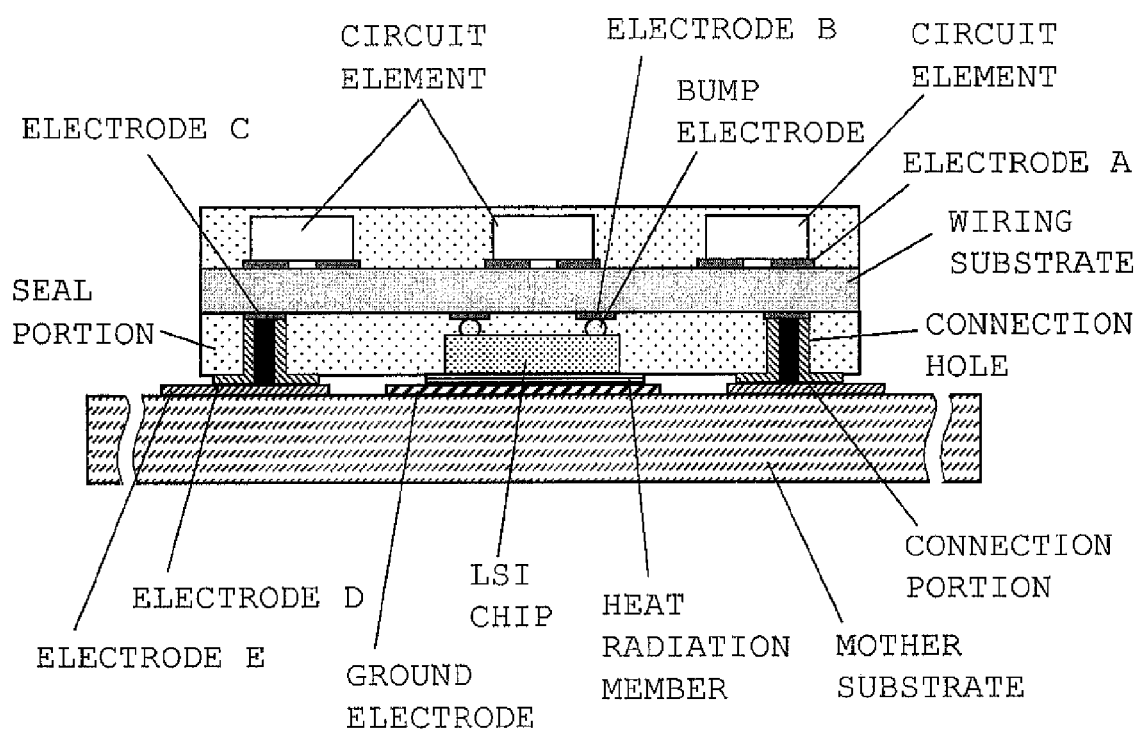
FIG. 21 is a view exemplifying a conventional, three-dimensionally integrated semiconductor device.

FIG. 20 is a set of views showing the steps of manufacturing a wiring-added post electrode component different from those shown in FIGS. 2(A) to 2(C) and FIGS. 18(A) to 18(C). A thin glass epoxy substrate having a solder resist layer applied to the surface thereof may be used as the insulating substrate shown in FIGS. 18(A) to 18(C). For manufacture of this wiring-added post electrode component, first, as shown in section (a) of FIG. 20, post electrodes and wiring traces are formed on one face (front face) of the glass epoxy substrate, and wiring traces are formed on the other face (back face) as well. The wiring traces on the front face and those on the back face are connected via substrate penetrating wiring. The wiring traces on the opposite faces and the substrate penetrating wiring form paths extending from the post electrodes to the positions of external electrodes, to thereby enable the external electrodes to be disposed at arbitrary positions different from the positions of the post electrodes.

Next, as shown in section (b) of FIG. 20, solder resist is applied such that openings are formed at the positions of the external electrodes. Meanwhile, section (c) of FIG. 20 shows a support portion with a separable adhesive applied thereto. This support portion and the adhesive themselves are the same as those having described with reference to FIGS. 18(A) to 18(C).

Next, the structure shown in section (b) is turned upside down, and adhered to the upper surface of the support portion carrying the adhesive applied thereto. Thus, a wiring-added post electrode component is completed. This wiring-added post electrode component may be used in the same manner as the wiring-added post electrode component exemplified in FIGS. 18(A) to 18(C). However, in the case where the wiring-added post electrode component of FIG. 20 is assembled into the three-dimensionally integrated semiconductor device as shown in FIG. 19, the support portion is separated and removed during the manufacture thereof. At that time, the solder resist layer remains as a protection film. Since openings for external electrodes have already been formed in the solder resist layer as described above, the external electrodes are connected to the wiring traces of the wiring-added post electrode component via the openings.

In the case where a glass epoxy substrate is used as a wiring substrate (see FIG. 1), the wiring-added post electrode component can be advantageously manufactured by the same substrate manufacturer, whereby throughput is improved greatly, which contributes to const reduction. The support portion is necessary so as to make the double-side wired glass epoxy substrate thin to a possible degree and make the finished package thin.

Although only some exemplary embodiments of the present invention have been described in detail above, many modifications are possible in the exemplary embodiments without materially departing from the novel teachings and advantageous effects of the present invention.

The invention claimed is:

1. A three-dimensionally integrated semiconductor device in which various circuit elements, including a semiconductor chip, are attached to opposite faces of a wiring substrate, the device being characterized in that the wiring substrate has, on each of first and second main faces thereof, connection pad portions to which various circuit elements are connected, and wiring traces for connecting the connection pad portions, and also has a through wiring portion for establishing mutual connection between the connection pad portions and the wiring traces on the first main face and the connection pad portions and the wiring traces on the second main face;

the semiconductor chip is attached to the first main face of the wiring substrate and is connected to the connection pad portions on the first main face, a post electrode component including a plurality of post electrodes supported by a support portion is fixed to and electrically connected to the wiring traces on the first main face at predetermined positions, resin sealing is performed, and the support portion is separated so as to expose end surfaces of the post electrodes; and another circuit element is disposed on the second main face of the wiring substrate and is connected to the connection pad portions on the second main face.

2. A three-dimensionally integrated semiconductor device according to claim 1, wherein the post electrode component includes wiring traces connected to the post electrodes, and the wiring traces are exposed when the support portion is separated.

3. A three-dimensionally integrated semiconductor device according to claim 2, wherein the post electrodes and the wiring traces connected thereto are formed on an insulating substrate adhered to the support portion by use of a separable adhesive; the insulating substrate exposed as a result of separation of the support portion is used as a protection film; openings are formed in the protection film; and external electrodes are connected to portions of the wiring traces exposed through the openings.

4. A three-dimensionally integrated semiconductor device according to claim 3, wherein the insulating substrate is a glass epoxy substrate and a solder resist layer covering wiring traces formed thereon; the solder resist layer exposed as a result of separation of the support portion is used as a protection film; and external electrodes are connected to the wiring traces through openings formed in the protection film.

5. A three-dimensionally integrated semiconductor device according to claim 1, wherein, on the second main face of the wiring substrate, the another circuit element is resin-sealed.

6. A three-dimensionally integrated semiconductor device according to claim 1, wherein, on the first main face of the wiring substrate, the resin sealing is performed such that the post electrodes are exposed to side surfaces of a formed resin seal.

7. A three-dimensionally integrated semiconductor device according to claim 6, wherein the post electrodes exposed to the side surfaces are soldered to wiring traces of a mother substrate with solder fillets formed such that meniscus are formed on the side surfaces of the post electrodes.

8. A three-dimensionally integrated semiconductor device according to claim 1, wherein the semiconductor chip is connected to the connection pad portions on the first main face by means of bonding wire connection or flip-chip connection.

9. A three-dimensionally integrated semiconductor device according to claim 1, wherein the circuit elements are stacked in three or more tiers.

10. A method for manufacturing a three-dimensionally integrated semiconductor device in which various circuit elements, including a semiconductor chip, are attached to opposite faces of a wiring substrate, the method comprising:

provdiing a wiring substrate which has, on each of first and second main faces thereof, connection pad portions to which various circuit elements are connected, and wiring traces for connecting the connection pad portions, and also has a through wiring portion for establishing mutual connection between the connection pad portions and the wiring traces on the first main face and the connection pad portions and the wiring traces on the second main face;

forming a post electrode component including a plurality of post electrodes supported by a support portion;

attaching the semiconductor chip to the first main face of the wiring substrate, connecting the semiconductor chip to the connection pad portions on the first main face, fixing and electrically connecting the post electrode component to the wiring traces on the first main face at predetermined positions, performing resin sealing, and separating the support portion so as to expose end surfaces of the post electrodes; and disposing another circuit element on the second main face of the wiring substrate, and connecting the another circuit element to the connection pad portions on the second main face.

11. A method for manufacturing a three-dimensionally integrated semiconductor device according to claim 10, wherein the post electrode component includes wiring traces connected to the post electrodes, and the wiring traces are exposed when the support portion is separated after the resin sealing.

12. A method for manufacturing a three-dimensionally integrated semiconductor device according to claim 11, wherein the post electrodes and the wiring traces connected thereto are formed on an insulating substrate adhered to the support portion by use of a separable adhesive; the insulating substrate exposed as a result of separation of the support portion after the resin sealing is used as a protection film; openings are formed in the protection film; and external electrodes are connected to portions of the wiring traces exposed through the openings.

13. A method for manufacturing a three-dimensionally integrated semiconductor device according to claim 12, wherein the insulating substrate is a glass epoxy substrate and a solder resist layer covering a glass epoxy substrate and wiring traces formed thereon; the solder resist layer exposed as a result of separation of the support portion after the resin sealing is used as a protection film; and external electrodes are connected to the wiring traces through openings formed in the protection film.

14. A method for manufacturing a three-dimensionally integrated semiconductor device according to claim 10, wherein, on the second main face of the wiring substrate, the another circuit element is resin-sealed.

15. A method for manufacturing a three-dimensionally integrated semiconductor device according to claim 10, wherein, on the first main face of the wiring substrate, the resin sealing is performed such that the post electrodes are exposed to side surfaces of a formed resin seal.

16. A method for manufacturing a three-dimensionally integrated semiconductor device according to claim 15, wherein the post electrodes exposed to the side surfaces are soldered to wiring traces of a mother substrate with solder fillets formed such that meniscus are formed on the side surfaces of the post electrodes.

17. A method for manufacturing a three-dimensionally integrated semiconductor device according to claim 10, wherein the semiconductor chip is connected to the connection pad portions on the first main face by means of bonding wire connection or flip-chip connection.

18. A method for manufacturing a three-dimensionally integrated semiconductor device according to claim 10, wherein the circuit elements are stacked in three or more tiers.

19. A three-dimensionally integrated semiconductor device in which various circuit elements, including a semiconductor chip, are attached to opposite faces of a wiring substrate, the device being characterized in that the wiring substrate has, on each of first and second main faces thereof, connection pad portions to which various circuit elements are connected, and wiring traces for connecting the connection pad portions, and also has a through wiring portion for establishing mutual connection between the connection pad portions and the wiring traces on the first main face and the connection pad portions and the wiring traces on the second main face;

the semiconductor chip is attached to the first main face of the wiring substrate and is connected to connection pad portions on the first main face, a plurality of post electrodes having an insulating substrate and wiring traces provided at the back thereof are electrically connected to the wiring traces on the first main face at predetermined positions, and resin sealing is performed such that end surfaces of the post electrodes are exposed; and another circuit element is disposed on the second main face of the wiring substrate and is connected to the connection pad portions on the second main face.

20. A three-dimensionally integrated semiconductor device according to claim 19, wherein the insulating substrate is a solder resist layer covering a glass epoxy substrate and wiring traces formed thereon; the solder resist layer is used as a protection film; and external electrodes are connected to the wiring traces through openings formed in the protection film.

* * * * *